(12) United States Patent
Lee et al.

(10) Patent No.: US 10,211,193 B2
(45) Date of Patent: Feb. 19, 2019

(54) HYBRID-TYPE POWER MODULE HAVING DUAL-SIDED COOLING

(71) Applicants: Hyundai Motor Company, Seoul (KR); Kia Motors Corporation, Seoul (KR)

(72) Inventors: Hyun Koo Lee, Seoul (KR); Woo Yong Jeon, Seoul (KR); Sang Cheol Shin, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 79 days.

(21) Appl. No.: 15/612,304

(22) Filed: Jun. 2, 2017

(65) Prior Publication Data
US 2018/0175010 A1 Jun. 21, 2018

(30) Foreign Application Priority Data

Dec. 15, 2016 (KR) .................. 10-2016-0171219

(51) Int. Cl.
| | |
|---|---|
| *H01L 25/18* | (2006.01) |
| *H01L 23/04* | (2006.01) |
| *H01L 25/065* | (2006.01) |
| *H05K 1/02* | (2006.01) |
| *H01L 23/538* | (2006.01) |
| *H05K 1/14* | (2006.01) |
| *H01L 23/498* | (2006.01) |
| *H01L 23/367* | (2006.01) |

(52) U.S. Cl.
CPC .............. *H01L 25/18* (2013.01); *H01L 23/04* (2013.01); *H01L 23/49811* (2013.01); *H01L 23/5381* (2013.01); *H01L 23/5386* (2013.01); *H01L 25/0652* (2013.01); *H05K 1/0203* (2013.01); *H05K 1/144* (2013.01); *H01L 23/367* (2013.01); *H05K 2201/042* (2013.01); *H05K 2201/10037* (2013.01); *H05K 2201/10522* (2013.01)

(58) Field of Classification Search
CPC ..... H01L 25/18; H01L 25/0652; H01L 23/04; H01L 23/367; H01L 23/5386; H01L 23/5381; H05K 1/144; H05K 1/0203; H05K 2201/042; H05K 2201/10037; H05K 2201/10522; H02P 5/68; H02P 27/06; B60L 11/1803
See application file for complete search history.

(56) References Cited

U.S. PATENT DOCUMENTS

| | | | | |
|---|---|---|---|---|
| 2010/0117570 | A1* | 5/2010 | Nishimori | H02M 7/003 318/400.3 |
| 2015/0214205 | A1* | 7/2015 | Tokuyama | H01L 25/18 257/139 |
| 2017/0197511 | A1* | 7/2017 | Yonak | B60L 11/1803 |

FOREIGN PATENT DOCUMENTS

| | | |
|---|---|---|
| JP | 2005-261035 A | 9/2005 |
| JP | 5879233 B2 | 3/2016 |
| KR | 20140078175 | 6/2014 |

* cited by examiner

*Primary Examiner* — Caridad Everhart
(74) *Attorney, Agent, or Firm* — Mintz Levin Cohn Ferris Glovsky and Popeo, P.C.; Peter F. Corless

(57) ABSTRACT

A hybrid-type power module having dual-sided cooling is provided. The power module includes semiconductor chips that is disposed on each of an upper board and a lower board at a location between the boards. The semiconductor chips of the upper board and the lower board have different electric capacities.

10 Claims, 6 Drawing Sheets

HYBRID-TYPE POWER MODULE HAVING DUAL-SIDED COOLING

CROSS REFERENCE TO RELATED APPLICATION

The present application claims priority to Korean Patent Application No. 10-2016-0171219, filed Dec. 15, 2016, the entire contents of which is incorporated herein for all purposes by this reference.

BACKGROUND

Field of the Invention

The present invention relates generally to a hybrid-type power module having dual-sided cooling, and more particularly, to a hybrid-type power module having dual-sided cooling, wherein a plurality of semiconductor chips are disposed at locations between two boards.

Description of the Related Art

In general, an inverter (HPCU) is required to operate a drive motor of a hybrid vehicle and an electric vehicle. To improve efficiency of the drive motor, it is necessary to improve cooling efficiency of a power module, which is a type of switch element included in the inverter, while reducing size of the power module. In particular, a power module having dual-sided cooling, in which semiconductor chips are installed between two boards, and a cooler is installed extraneous to each of the two boards, has higher cooling efficiency than a power module having one-sided cooling and provides a simplified a circuit structure. Thus, this technology is important for reducing size of the power module.

Meanwhile, two types of motors may be used for the hybrid vehicle. The driving motor uses a comparatively substantial amount of power, whereas a starting motor or a driving assist motor uses relatively low amount of power. Since one power module may supply only a predetermined power determined by the capacity of the semiconductor chip, power modules provided with semiconductor chips having different power capacities are used to operate the different types of motors. However, when the power module is installed according to power capacity, size of the inverter is excessively increased, thereby resulting in an increase in manufacturing costs and maintenance costs. Accordingly, there is a demand for a power module having a reduced size structure and which is capable of including semiconductor chips having different power capacities.

The foregoing is intended merely to aid in the understanding of the background of the present invention, and is not intended to mean that the present invention falls within the purview of the related art that is already known to those skilled in the art.

SUMMARY

Accordingly, the present invention provides a hybrid-type power module having dual-sided cooling in which semiconductor chips having different power capacities are installed on a single board, whereby size of the power module may be reduced.

According to one aspect of the present invention, a hybrid-type power module having double-sided cooling may include: at least one semiconductor chip disposed on each of an upper board and a lower board between the boards, the semiconductor chips of the upper board and the lower board having different electric capacities.

The semiconductor chips may include: a first semiconductor chip; and a third semiconductor chip having a different electric capacity from the first semiconductor chip, and the lower board may include: a positive terminal connected to an anode of a battery; a negative terminal connected to a cathode of the battery; a first output terminal configured to output electric power supplied from the first semiconductor chip; and a second output terminal configured to output electric power supplied from the third semiconductor chip.

The semiconductor chips may further include: a second semiconductor chip having the same electric capacity as the first semiconductor chip; and a fourth semiconductor chip having the same electric capacity as the third semiconductor chip, and the lower board may include: a first electrode having the first semiconductor chip and the third semiconductor chip, and connected to the positive terminal; a second electrode having the third semiconductor chip and connected to the first output terminal; a third electrode having the fourth semiconductor chip and connected to the second output terminal; and a fourth electrode connected to the negative terminal.

Further, the upper board may include: a first bridge terminal that connects the first semiconductor chip and the second electrode; a second bridge terminal that connects both the second semiconductor chip and the fourth semiconductor chip to the fourth terminal; and a third bridge terminal that connects the third semiconductor chip and the third electrode. The first electrode may be disposed on a first portion of an upper surface of the lower board, the second electrode may be disposed on a second portion of the upper surface of the lower board, the third electrode may be disposed between the first electrode and the second electrode, and the fourth electrode may be disposed at a location adjacent to the first and third electrodes. The first semiconductor chip may be disposed on a first side of the first electrode and the third semiconductor chip may be disposed on a second side of the first electrode.

The semiconductor chips may further include: a second semiconductor chip having the same capacity as the first semiconductor chip; and a fourth semiconductor chip having the same capacity as the third semiconductor chip, and the lower board may include: a first electrode having the first semiconductor chip and the third semiconductor chip, and connected to the positive terminal; and a second electrode having the second semiconductor chip and the fourth semiconductor chip and connected to the negative terminal.

Additionally, the first electrode may include: a first connecting electrode configured to apply an electric current that passes through the first semiconductor chip to the second electrode and a second connecting electrode configured to apply an electric current that passes through the third semiconductor chip to the second electrode. The second electrode may include: a third connecting electrode configured to apply an electric current from the first connecting electrode to the second semiconductor chip and a fourth connecting electrode configured to apply an electric current from the second connecting electrode to the fourth semiconductor chip. The upper board may include: a third bridge terminal that connects the first connecting electrode and the third connecting electrode and a fourth bridge terminal that connects the second connecting electrode and the fourth connecting electrode.

The first electrode may be formed in a U-shape on an upper surface of the lower board along all but one side of the lower board, and the second electrode may be disposed on the one side of the upper surface of the lower board on which the first electrode is not disposed such that the second electrode is surrounded by the first electrode. The first semiconductor chip may be disposed on a first end of the U-shaped first electrode, and the third semiconductor chip may be disposed on a second end of the U-shaped first electrode.

The hybrid-type power module having dual-sided cooling according to the present invention has the following effects.

First, it may be possible to reduce size of the power module by installing semiconductor chips having different power capacities on a single board.

Second, it may be possible to supply power from one battery to a plurality of semiconductor chips simultaneously, thereby achieving improved power efficiency and a reduction in size.

Third, the semiconductor chips having different power capacities are not usually operated simultaneously, and thus it may be possible to improve cooling efficiency.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION

Figure 1:
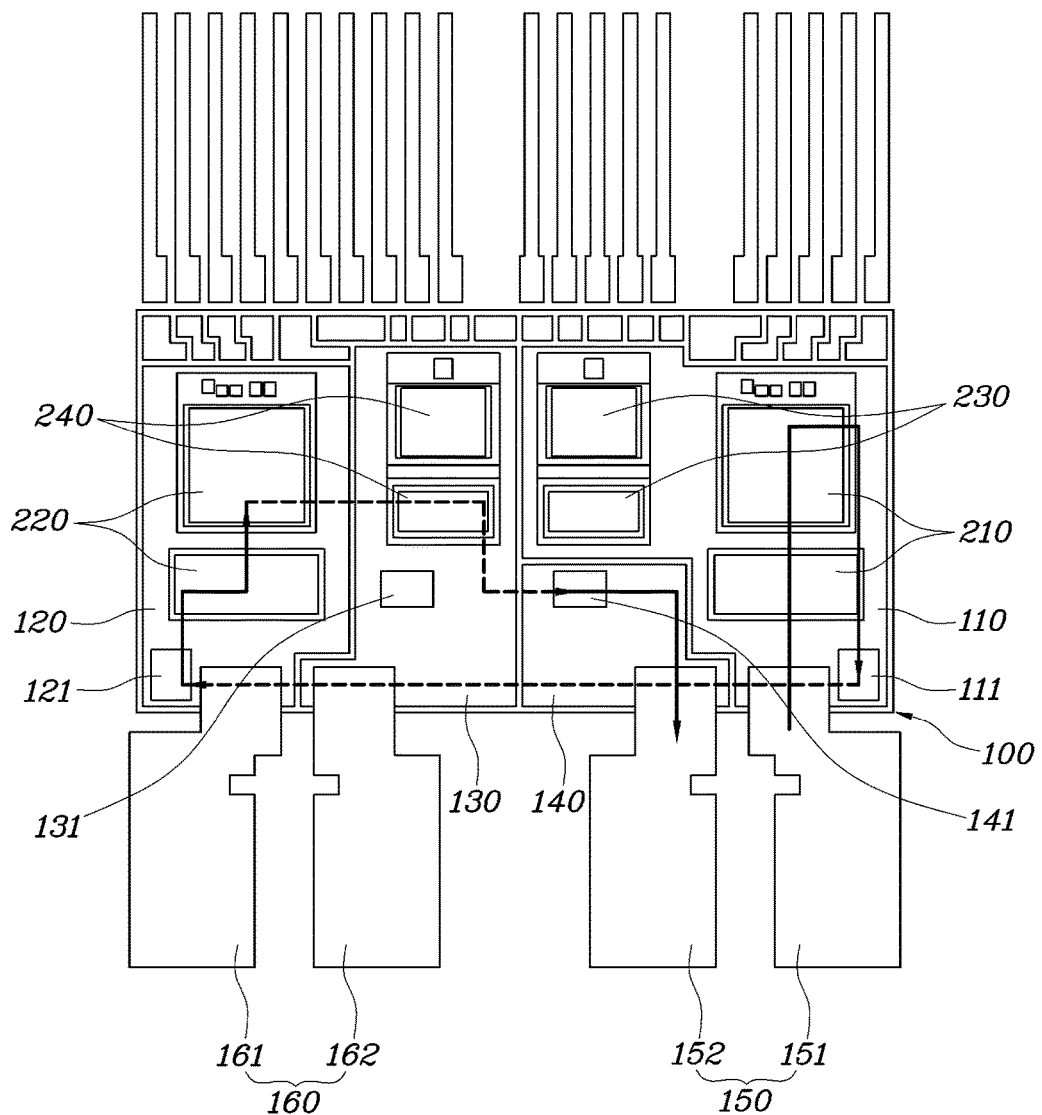
FIG. 1 is a view showing an electric current flow passing through a large-capacity semiconductor chip of a lower board according to an exemplary embodiment of the present invention.
Figure 2:
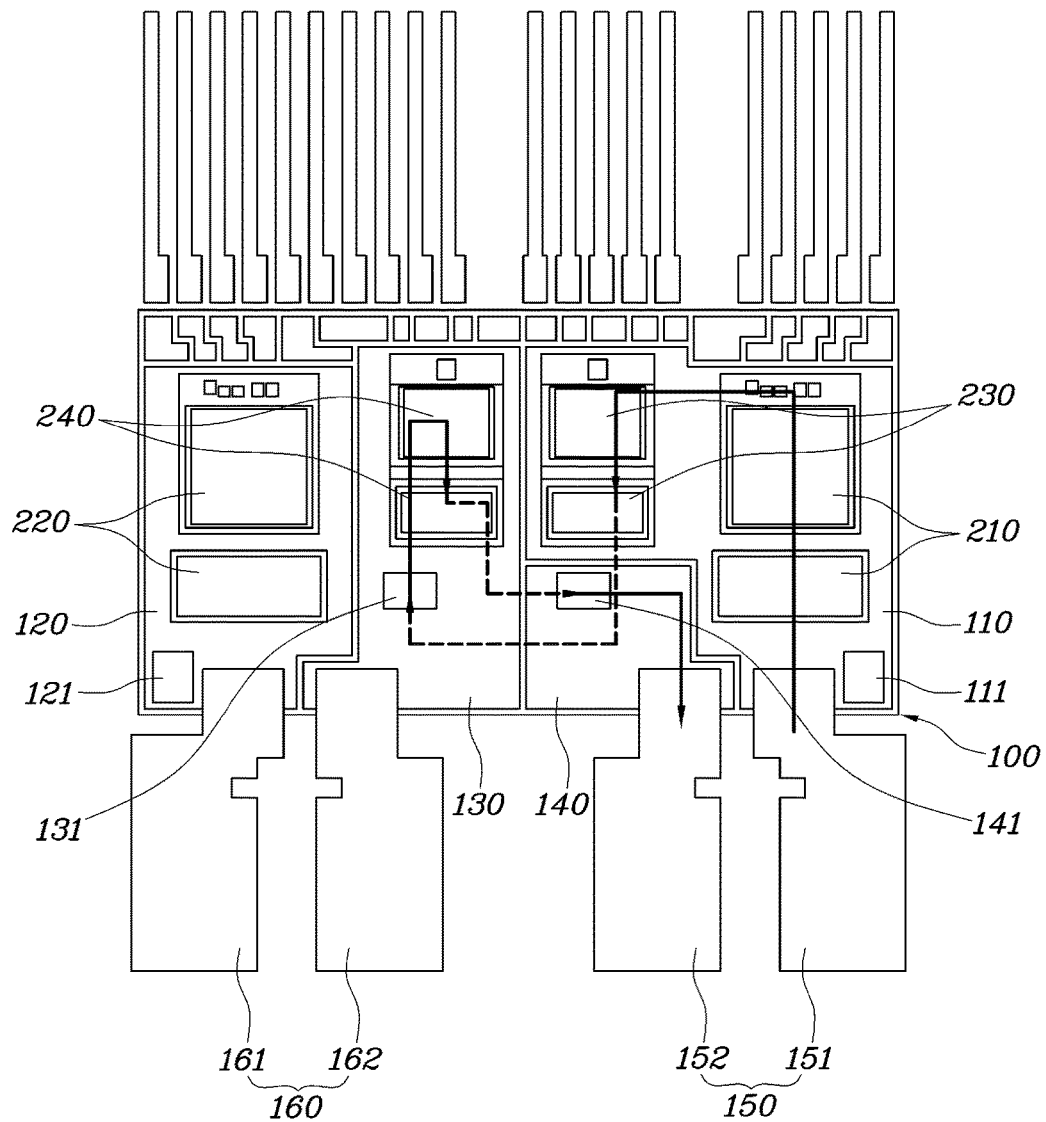
FIG. 2 is a view showing an electric current flow passing through a low-capacity semiconductor chip of the lower board according to the exemplary embodiment of the present invention.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referral to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor. The memory is configured to store the modules and the processor is specifically configured to execute said modules to perform one or more processes which are described further below.

The terminology used herein is for the purpose of describing particular embodiments only and is not intended to be limiting. As used herein, the singular forms "a", "an", and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Unless otherwise defined, all terms including technical and scientific terms used herein have the same meaning as commonly understood by one of ordinary skill in the art to which the present invention belongs. It will be further understood that terms used herein should be interpreted as having a meaning that is consistent with their meaning in the context of this specification and the relevant art and will not be interpreted in an idealized or overly formal sense unless expressly so defined herein.

Hereinafter, a hybrid-type power module having dual-sided cooling according to an exemplary embodiment of the present invention will be described with reference to the accompanying drawings. As shown in FIGS. 1 to 4, the power module according to an exemplary embodiment of the present invention may include semiconductor chips 210 and 220 having different power capacities, the semiconductor chips 210 and 220 disposed on each of an upper board 300 and a lower board 100 at a location therebetween. In particular, the arrows shown in the drawings indicate flow of an electric current that flows into a positive terminal 151 and flows out to a negative terminal 152.

In other words, a first semiconductor chip 210 and a third semiconductor chip 230 having a power capacity different from that of the first semiconductor chip 210 may be disposed on each of a pair of boards 100 and 300 at a location therebetween (e.g., disposed between the boards 100 and 300), and thus, power having different outputs may be supplied from one power module. Additionally, the lower board 100 may include: a first electrode 110 connected to the positive terminal 151 connected to an anode of a battery (not shown); a second electrode connected to a first output terminal 161 configured to transmit power output from the first semiconductor chip 210 to a motor (not shown); a third electrode 130 connected to a second output terminal 162 configured to transmit power from the third semiconductor chip 230 to the motor; and a fourth electrode 140 connected to the negative terminal 152 connected to a cathode of the battery.

Among the plurality of semiconductor chips, the first semiconductor chip 210 and the third semiconductor chip 230 may be disposed on the positive terminal 151. In particular, an electric current that passes through the first and third semiconductor chips 210 and 230 may be transmitted to the negative terminal 152 via electrodes of the upper board 300, which will be described later. To reduce the size of the power module and simplify the circuit design, it is common to install two semiconductor chips on one mold. In other words, the power module according to the present invention may further include a second semiconductor chip 220 having the same capacity as the first semiconductor chip 210, and a fourth semiconductor chip 240 having the same capacity as the third semiconductor chip 230. The second semiconductor chip 220 may be disposed on the first output terminal 161, and the fourth semiconductor chip 240 may be disposed on the second output terminal 162.

An electric current that flows through the positive terminal 151 passes sequentially through the first semiconductor chip 210, the second semiconductor chip 220, the third semiconductor chip 230 and the fourth semiconductor chip 240 and then flows out through the negative terminal 152. Particularly, a direct current generated in the first and second semiconductor chips 210 and 220 may be output through the first output terminal 161, and a direct current generated in the third and fourth semiconductor chips 230 and 240 may be output through the second output terminal 162.

Figure 3:
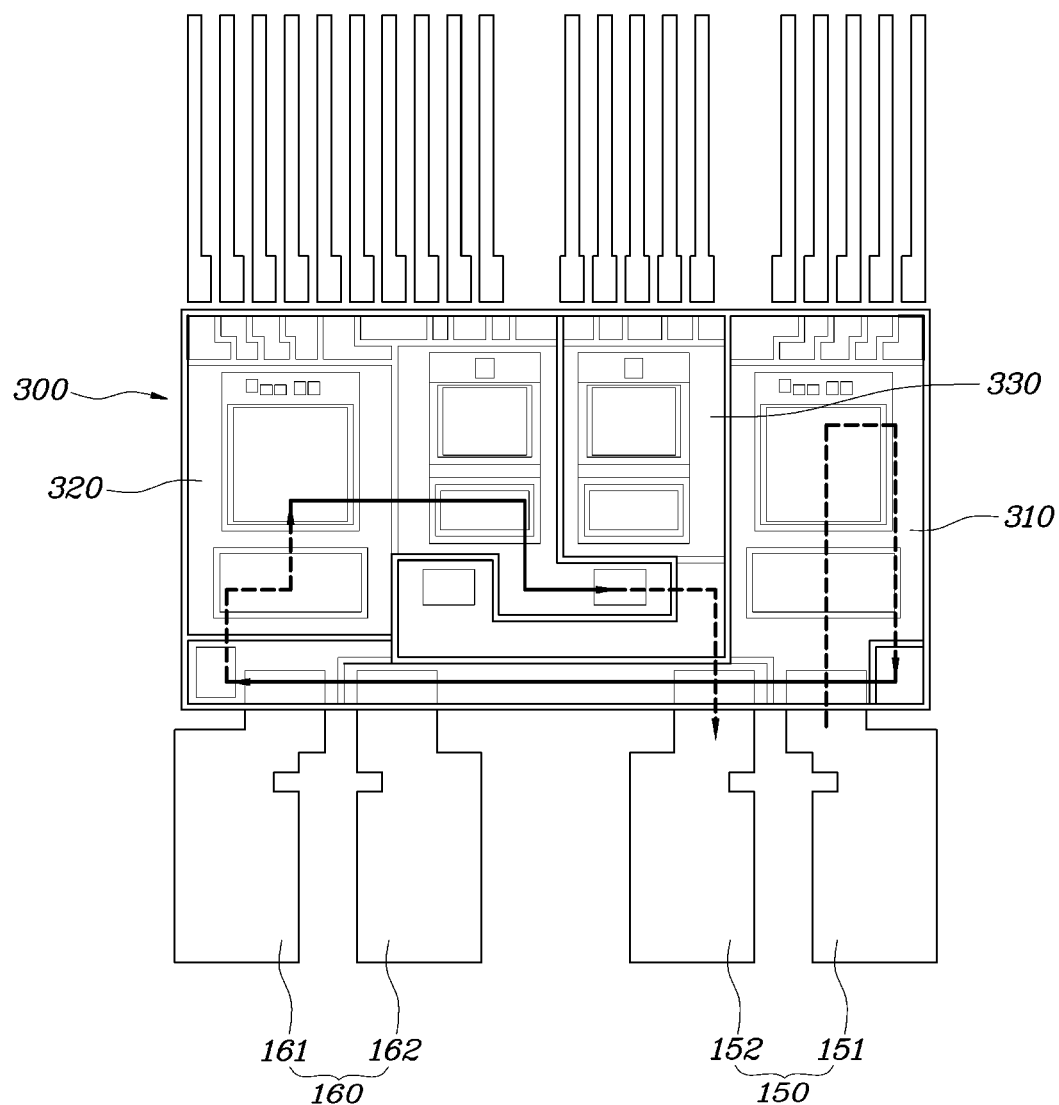
FIG. 3 is a view showing an electric current flow passing through the large-capacity semiconductor chip of an upper board according to the exemplary embodiment of the present invention.
Figure 4:
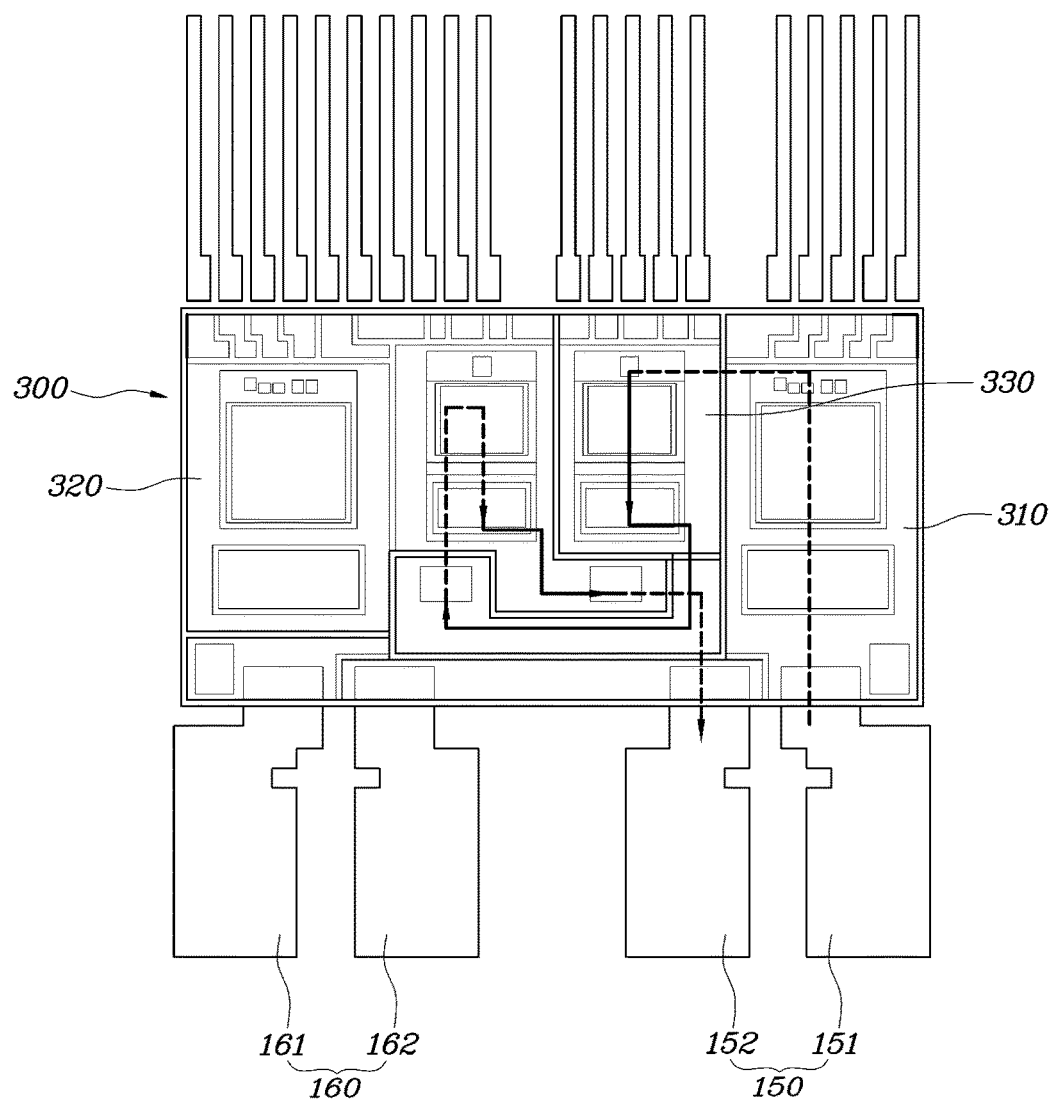
FIG. 4 is a view an electric current flow passing through the low-capacity semiconductor chip of the upper board according to the exemplary embodiment of the present invention.

Furthermore, the upper board 300 may include three electrodes such as a first bridge terminal 310, a second bridge terminal 320, and a third bridge terminal 330. The first bridge terminal 310 may connect the first semiconductor chip 210 and the second electrode 120, the second bridge terminal 320 may connect both the second semiconductor chip 220 and the fourth semiconductor chip 240 to the fourth electrode 140, and the third bridge terminal 330 may connect the third semiconductor chip 230 and the third electrode 130, thereby transmitting the direct current. In other words, as shown FIGS. 1 and 2, an electric current that flows into the first electrode 110 through the positive terminal 151 has a first path route in which the electric current may sequentially pass the first semiconductor chip 210, the first bridge terminal 310, the second electrode 120, the second semiconductor chip 220, the second bridge terminal 320, the fourth electrode 140, and the negative terminal 152 and then may be output. Further, as shown in FIGS. 3 and 4, the electric current that flows into the first electrode 110 through the positive terminal 151 has a second path route in which the electric current may sequentially pass the third semiconductor chip 230, the third bridge terminal 330, the third electrode 130, the fourth semiconductor chip 240, the second bridge terminal 320, the fourth electrode 140, and the negative terminal 152 and then may be output.

In addition, the first electrode 110 is provided at a right side end in the drawing, the second electrode 120 is provided at a left side end in the drawing, the third electrode 130 is provided between the first electrode 110 and the second electrode 120, and the fourth electrode 140 is provided at a right side of the third electrode 130 and a left lower side of the first electrode 110. In particular, the first electrode 110 may be formed in an L-shape, and thus, the first electrode 110 may be coupled with the positive terminal 151 at a first end thereof, and may include the first semiconductor chip 210 at a center portion thereof, and the third semiconductor chip 230 at a second end thereof.

The second electrode 120 may be formed in a rectangular shape, and thus, the second electrode 120 may be coupled with the first output terminal 161 at a lower end thereof, and may include the second semiconductor chip 220 at a center portion thereof. The third electrode 130 may also be formed in a rectangular shape, and thus, the third electrode 130 may be coupled with the second output terminal 162 at a lower end thereof, and may include the fourth semiconductor chip 240 at an upper end thereof. The fourth electrode 140 may be formed in a rectangular shape, and may be coupled with the negative terminal 152 at a lower end thereof.

Further, the first electrode 110 may include a first connection part 111 connected to the first bridge terminal 310, the second electrode 120 may include a second connection part 121 connected to the first bridge terminal 310, the third electrode 130 may include a third connection part 131 connected to the third bridge terminal 330, and the fourth electrode 140 may include a fourth connection part 141 connected to the second bridge terminal 320.

According to the exemplary embodiment of the present invention, when the semiconductor chips having the same capacity are respectively installed at both sides and a central part of the board, an insulation distance between the terminals may be reduced and the size of the power module may be further reduced. Moreover, semiconductor chips having different capacities and disposed at a location adjacent to each other are not usually operated simultaneously, and thus it may be possible to improve cooling efficiency.

Figure 5:
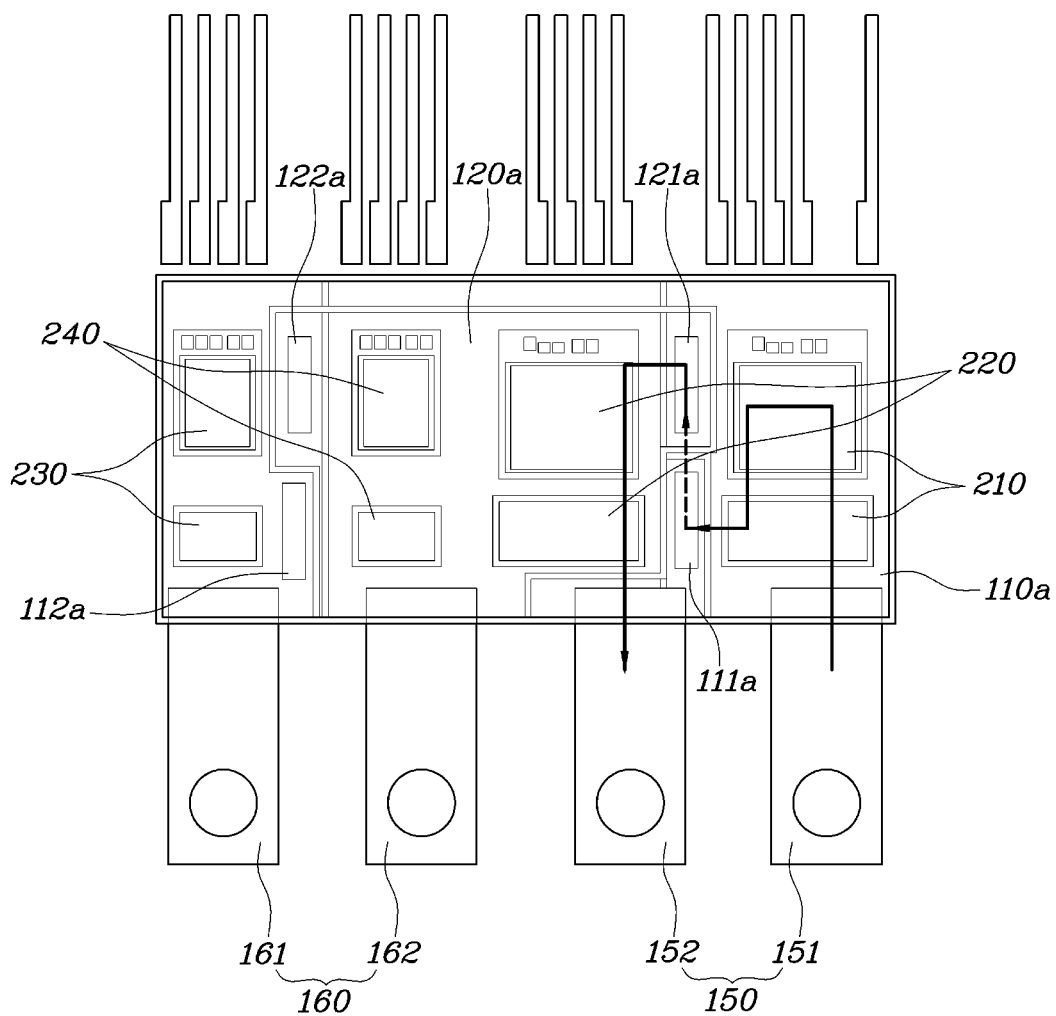
FIG. 5 is a view showing an electric current flow passing through a large-capacity semiconductor chip of a lower board according to an exemplary embodiment of the present invention.
Figure 6:
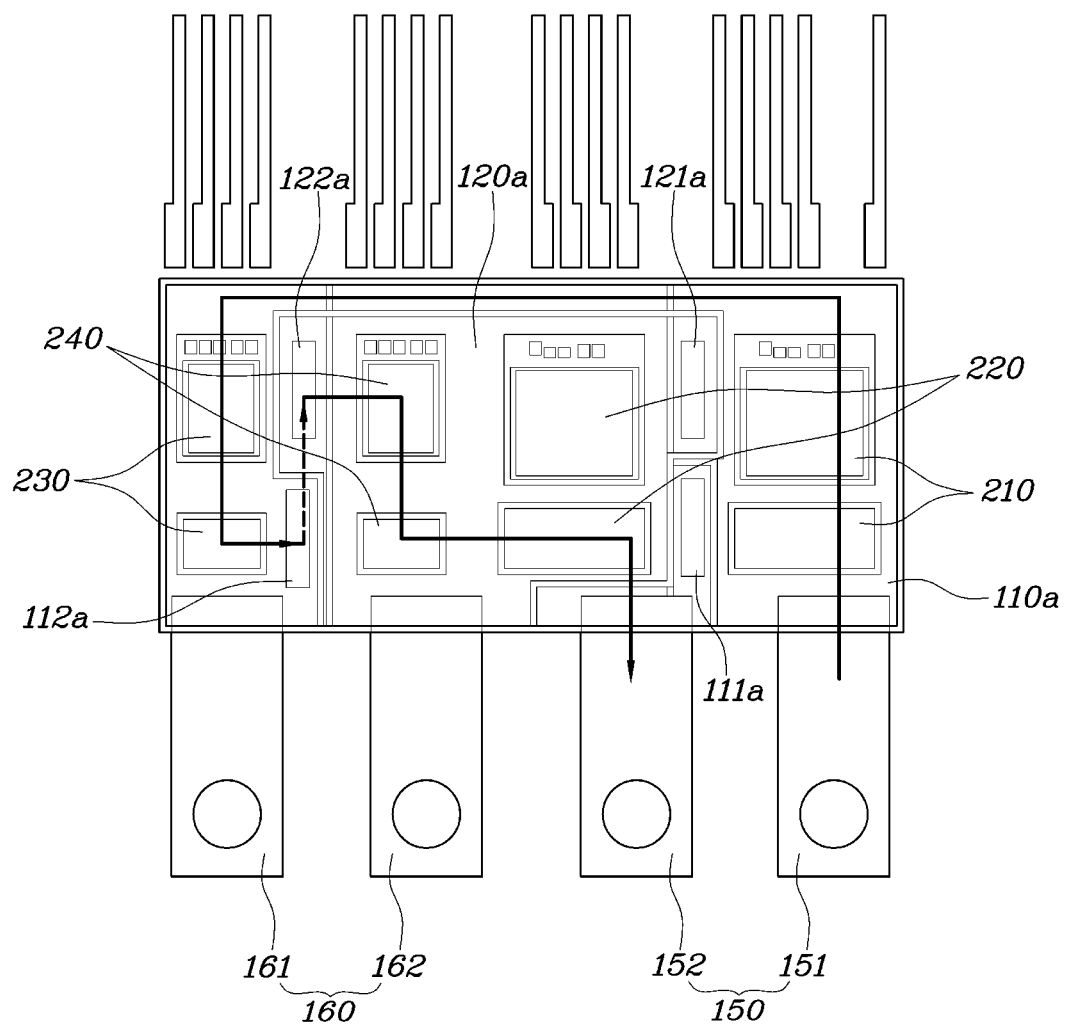
FIG. 6 is a view showing an electric current flow passing through a low-capacity semiconductor chip of the lower board according to the exemplary embodiment of the present invention.

Hereinafter, another exemplary embodiment according to the present invention will be described. As shown in FIGS. 5 and 6, a power module according to another exemplary embodiment of the present invention may include the lower board 100 in which a first electrode 110a may be coupled to the positive terminal 151, and a second electrode 120a may be coupled to the negative terminal 152. The first electrode 110a may include the first semiconductor chip 210 and the third semiconductor chip 230, and the second electrode 120a may include the second semiconductor chip 220 and the fourth semiconductor chip 240.

A first connecting electrode 111a and a second connecting electrode 112a may be disposed at the first electrode 110a. The first connecting electrode 111a may be configured to apply an electric current that passes through the first semiconductor chip 210 to the second electrode 120a. The second connecting electrode 112a may be configured to apply an electric current that passes through the third semiconductor chip 230 to the second electrode 120a. In response, a first connecting electrode 121a and a second connecting electrode 122a may be disposed at the second electrode 120a. The first connecting electrode 121a may be configured to apply an electric current that passes through the first connecting electrode 111a to the second semiconductor chip 220, and the second connecting electrode 122a may be configured to apply an electric current that passes through the second connecting electrode 112a to the fourth semiconductor chip 240.

Although not shown in detail in the drawings, the upper board 300 may include: a fourth bridge terminal that connects the first connecting electrode 111a and the first connecting electrode 121a; and a fifth bridge terminal that connects the second connecting electrode 112a and the second connecting electrode 122a The first electrode 110a may be formed in a U-shape, and thus, the first electrode 110a may be coupled with the positive terminal 151 at a first end thereof, and coupled with the first output terminal 161 at a second end thereof. The first semiconductor chip 210 may be disposed at a location adjacent to the positive terminal 151 and the third semiconductor chip 230 may be disposed at a location adjacent to the first output terminal 161. The second electrode 120a may be formed in a substantially rectangular shape, and thus, the second electrode 120a may be coupled with both the negative terminal 152 and the second output terminal 162 at a lower end thereof. The second semiconductor chip 220 may be disposed at a location adjacent to the first semiconductor chip 210 and the fourth semiconductor chip 240 may be disposed at a location adjacent to the third semiconductor chip 230.

By manufacturing the power module according to another exemplary embodiment of the present invention as described above, it may be possible to simplify a circuit configuration by installing the semiconductor chips having the same capacity to be adjacent to each other, and to reduce size of the power module by packaging two semiconductor chips having the same capacity.

Although an exemplary embodiment of the present invention has been described for illustrative purposes, those skilled in the art will appreciate that various modifications, additions and substitutions are possible, without departing from the scope and spirit of the invention as disclosed in the accompanying claims. Therefore, exemplary embodiments of the present invention have been described for illustrative purposes, and should not be construed as being restrictive. The scope of the present invention is defined by the accompanying claims rather than the description which is presented above. Moreover, the present invention is intended to cover not only the exemplary embodiments, but also various alternatives, modifications, equivalents and other embodiments that may be included within the spirit and scope of the present invention as defined by the appended claims.

What is claimed is:

1. A hybrid-type power module having dual-sided cooling, comprising:
   semiconductor chips disposed on each of an upper board and a lower board at a location between the boards,
   wherein the semiconductor chips of the upper board and the lower board have different electric capacities,
   wherein the semiconductor chips include:
      a first semiconductor chip;
      a second semiconductor chip having the same electric capacity as the first semiconductor chip;
      a third semiconductor chip having a different electric capacity from the first semiconductor chip; and
      a fourth semiconductor chip having the same electric capacity as the third semiconductor chip,
   wherein the lower board includes:
      a positive terminal connected to an anode of a battery;
      a negative terminal connected to a cathode of the battery;
      a first output terminal configured to output electric power supplied from the first semiconductor chip;
      a second output terminal configured to output electric power supplied from the third semiconductor chip;
      a first electrode provided with the first semiconductor chip and the third semiconductor chip, and connected to the positive terminal;
      a second electrode provided with the third semiconductor chip and connected to the first output terminal;
      a third electrode provided with the fourth semiconductor chip and connected to the second output terminal; and
      a fourth electrode connected to the negative terminal.

2. The power module of claim 1, wherein the upper board includes:
   a first bridge terminal that connects the first semiconductor chip and the second electrode;
   a second bridge terminal that connects both the second semiconductor chip and the fourth semiconductor chip to the fourth terminal; and
   a third bridge terminal that connects the third semiconductor chip and the third electrode.

3. The power module of claim 1, wherein the first electrode is disposed on a first portion of an upper surface of the lower board, the second electrode is disposed on a second portion of the upper surface of the lower board, the third electrode is disposed between the first electrode and the second electrode, and the fourth electrode is disposed at a location adjacent to the first and third electrodes, wherein the first semiconductor chip is disposed on a first side of the first electrode, and the third semiconductor chip is disposed on a second side of the first electrode.

4. The power module of claim 1, wherein the semiconductor chips further include:
   a second semiconductor chip having the same capacity as the first semiconductor chip; and
   a fourth semiconductor chip having the same capacity as the third semiconductor chip.

5. A hybrid-type power module having dual-sided cooling, comprising:
   semiconductor chips disposed on each of an upper board and a lower board at a location between the boards,
   wherein the semiconductor chips of the upper board and the lower board have different electric capacities,
   wherein the semiconductor chips include:
      a first semiconductor chip;
      a second semiconductor chip having the same electric capacity as the first semiconductor chip;
      a third semiconductor chip having a different electric capacity from the first semiconductor chip; and
      a fourth semiconductor chip having the same electric capacity as the third semiconductor chip,
   wherein the lower board includes:
      a positive terminal connected to an anode of a battery;
      a negative terminal connected to a cathode of the battery;
      a first output terminal configured to output electric power supplied from the first semiconductor chip;
      a second output terminal configured to output electric power supplied from the third semiconductor chip;
      a first electrode provided with the first semiconductor chip and the third semiconductor chip, and connected to the positive terminal; and
      a second electrode provided with the second semiconductor chip and the fourth semiconductor chip and connected to the negative terminal.

6. The power module of claim 5, wherein the first electrode includes:
   a first connecting electrode configured to apply an electric current that passes through the first semiconductor chip to the second electrode; and
   a second connecting electrode configured to apply an electric current that passes through the third semiconductor chip to the second electrode.

7. The power module of claim 6, wherein the second electrode includes:
   a third connecting electrode configured to apply an electric current from the first connecting electrode to the second semiconductor chip, and
   a fourth connecting electrode configured to apply an electric current from the second connecting electrode to the fourth semiconductor chip.

8. The power module of claim 7, wherein the upper board includes:
   a third bridge terminal that connects the first connecting electrode and the third connecting electrode; and
   a fourth bridge terminal that connects the second connecting electrode and the fourth connecting electrode.

9. The power module of claim 5, wherein the first electrode is formed in a U-shape on an upper surface of the lower board along sides of the lower board except for one side, and the second electrode is disposed on the one side of the upper surface of the lower board such that the second electrode is surrounded by the first electrode.

10. The power module of claim 9, wherein the first semiconductor chip is disposed on a first end of the U-shaped first electrode, and the third semiconductor chip is disposed on a second end of the U-shaped first electrode.

* * * * *